United States Patent [19]

Friedlander et al.

Best Available Copy

[11] E Re. 30,772

[45] Reissued Oct. 13, 1981

[54] AMIDE-MODIFIED URETHANE ACRYLATE RADIATION CURABLE COMPOUNDS AND COATING COMPOSITIONS AND METHODS OF MAKING SAME

[75] Inventors: Charles B. Friedlander, Glenshaw; Gerald W. Gruber, Wexford; Rostyslaw Dowbenko, Gibsonia, all of Pa.

[73] Assignee: PPG Industries, Inc., Pittsburgh, Pa.

[21] Appl. No.: 155,711

[22] Filed: Jun. 2, 1980

Related U.S. Patent Documents

Reissue of:

[64] Patent No.: 4,153,776
Issued: May 8, 1979
Appl. No.: 890,895
Filed: Mar. 28, 1978

[51] Int. Cl.[3] ..... C08G 18/38

[52] U.S. Cl. ..... 525/421; 528/49; 528/75; 560/24; 560/25; 560/115; 560/157; 560/158

[58] Field of Search ..... 525/421; 528/49, 75; 560/24, 25, 115, 157, 158

[56] References Cited

U.S. PATENT DOCUMENTS

| | | | |
|---|---|---|---|
| 3,509,234 | 4/1970 | Burlant et al. | 525/126 |
| 3,641,199 | 2/1972 | Niederhauser et al. | 260/859 R |
| 3,653,950 | 4/1972 | Bonsignore | 117/72 |
| 3,714,110 | 1/1973 | Verdol et al. | 260/33.6 AQ |
| 4,038,257 | 7/1977 | Suzuki et al. | 528/75 |

FOREIGN PATENT DOCUMENTS

| | | |
|---|---|---|
| 2033157 | 1/1971 | Fed. Rep. of Germany . |
| 2404239 | 8/1974 | Fed. Rep. of Germany . |
| 2433908 | 2/1976 | Fed. Rep. of Germany . |
| 2544313 | 4/1976 | Fed. Rep. of Germany . |
| 752889 | 7/1956 | United Kingdom . |
| 1034945 | 7/1966 | United Kingdom . |
| 1056646 | 1/1967 | United Kingdom . |
| 1078155 | 8/1967 | United Kingdom . |
| 1142330 | 2/1969 | United Kingdom . |
| 1241038 | 7/1971 | United Kingdom . |
| 1278701 | 6/1972 | United Kingdom . |
| 1323313 | 7/1973 | United Kingdom . |
| 1363230 | 8/1974 | United Kingdom . |
| 1374464 | 11/1974 | United Kingdom . |
| 1474859 | 5/1977 | United Kingdom . |
| 1505898 | 3/1978 | United Kingdom . |

*Primary Examiner*—Maurice J. Welsh
*Attorney, Agent, or Firm*—George D. Morris

[57] ABSTRACT

Radiation curable compounds are disclosed comprising an amide moiety, a urethane moiety and an ethylenically unsaturated functional group, typically an acrylate functional group. The compounds comprise the reaction products of an amide-containing compound having at least one hydroxy functional group, a polyisocyanate and a polyfunctional compound having a hydroxy functional group reactive with an isocyanato group of the polyisocyanate, which polyfunctional compound provides an ethylenic functional group in the reaction product. Coating compositions containing these radiation curable reaction products cure at relatively high rates to form films having high abrasion resistance and improved tensile strength and elongation properties as compared to conventional urethane acrylate coating compositions.

40 Claims, No Drawings

AMIDE-MODIFIED URETHANE ACRYLATE RADIATION CURABLE COMPOUNDS AND COATING COMPOSITIONS AND METHODS OF MAKING SAME

Matter enclosed in heavy brackets [ ] appears in the original patent but forms no part of this reissue specification; matter printed in italics indicates the additions made by reissue.

BACKGROUND OF THE INVENTION

1. Field of the Invention

Radiation sensitive compounds which polymerize rapidly in the presence of actinic or ionizing radiation are of interest for use in film-forming compositions. Of particular interest are fast-curing compounds which provide elastomeric and wearlayer films having improved durability and flexibility.

2. Description of the Prior Art

Film-forming compositions containing radiation curable components are well-known. Films formed from compounds having urethane moieties and acrylate functional groups are recognized to possess good wear and weather resistance properties and also have good flexural strength properties. Typical of these urethane-acrylate radiation-curable film-forming materials are the compositions disclosed in U.S. Pat. No. 3,509,234 to Burlant et al and U.S. Pat. No. 4,038,257 to Suzuki et al. Although these urethane acrylate compositions have gained widespread acceptance for forming protective and decorative films on a variety of substrates, there is ever increasing demand for compositions which cure quickly to form tough, flexible films. The advantages of shorter curing times include productivity increases coupled with potential savings in energy consumption. Moreover, a composition which cures quickly after application to a substrate is likely to form a cured coating of higher gloss and smoothness inasmuch as the wet film is exposed for a lesser period of time to contamination from dust-laden environments typically attending coating operations.

Coating compositions containing very fast curing components have been devised. For example, U.S. application Ser. No. 821,856, filed Aug. 7, 1977, of G. W. Gruber, discloses coating compositions containing amide moieties and acrylate functional groups that can form very hard films on coated substrates passing under a curing radiation source at about 350 feet per minute. These amide acrylate compounds do not, however, provide cured films having particularly good flexural strength properties.

Fast-curing compositions for forming tough, flexible protective or decorative films would be quite useful for coating floor tile, vinyl overlays used in covering furniture and other articles, and various other flexible substrates. Baseboard coving, for example, is typically made of rubber or flexible plastic materials which require protective films of good flexibility since the coving materials are frequently shipped in rolls and are folded or bent during application to a wall base. Vinyl overlay coverings, often only two to ten thousandths of an inch in thickness, are frequently used to cover furniture and other articles having sharp-angled surface configurations. Protective films for these vinyl coverings must have sufficient flexural and tensile strength properties to withstand folding and creasing without the film cracking, tearing or lifting from the vinyl substrate.

SUMMARY OF THE INVENTION

It has now been found that relatively fast-curing coating compositions that form films of improved flexural or tensile strength may be provided by having present in the compositions at least one addition polymerizable, radiation curable compound containing at least one amide group, at least one urethane group and at least one ethylenically unsaturated functional group. Each member of the preferred class of these amide urethane acrylate compounds comprises the addition reaction product of the components of (a) an amide-containing compound having at least one hydroxy functional group, (b) a polyisocyanate and (c) a polyfunctional compound containing at least one functional group reactive with an isocyanato group of the polyisocyanate and which polyfunctional compound provides at least one ethylenically unsaturated functional group in the reaction product.

In addition to having improved physical strength properties, films formed from compositions having one or more of the described addition polymerizable compounds generally exhibit good elongation properties.

DESCRIPTION OF THE PREFERRED EMBODIMENTS

The addition polymerizable radiation curable compound derived from the addition reaction of an amide compound containing a hydroxy functional group, a polyisocyanate and the described polyfunctional compound may be generally characterized as an amide urethane acrylate reaction product in that the product comprises molecules having at least one each of an amide group, a urethane group and an acrylate group. In the presence of actinic light or ionizing radiation, the acrylate groups of the molecules cross-link to form durable, abrasion-resistant films built from a network of molecular units containing the amide and urethane moieties. Addition polymerization of the amide urethane acrylate compounds may also be accomplished by heat or by free radical-generating peroxide catalysts. It is believed that the improved flexural strength properties of films made from compositions containing amide urethane acrylate compounds is due to the presence in the film network of urethane groups which provide flexibility. Wear-resistance properties of the film are believed attributable to the presence of amide groups.

The term "amide hydroxy compound" as used hereinafter is intended as an abbreviated expression for an amide-containing compound having at least one hydroxy functional group. Suitable amide hydroxy compounds for preparing the amide urethane acrylate reaction product may be selected from such general classes of compounds as (a) a reaction product of a monocarboxylic acid and an aminoalcohol, (b) a reaction product of an ester of a carboxylic acid and an aminoalcohol, (c) a reaction product of a hydroxy carboxylic acid and a compound containing at least one primary or secondary amino nitrogen, (d) a reaction product of an inner ester of a hydroxy carboxylic acid, such as lactone, and ammonia or a compound containing at least one primary or secondary amino nitrogen, and (e) a polyamide polyol.

Where the amide hydroxy compound is prepared from the reaction of a monocarboxylic acid and an aminoalcohol, the monocarboxylic acid may be any organic acid having one carboxyl group attached to either an aliphatic group or an aryl group; the organic portion of the acid may be fully saturated or may contain unsaturated groups. The aliphatic and aryl groups may be substituted or unsubstituted. Typically suitable monocarboxylic acids include formic acid, acetic acid, propionic acid, butyric acid, valeric acid, caproic acid, caprylic acid, 2-ethyl hexanoic acid, lauric acid, myristic acid, palmitic acid, stearic acid, oleic acid, linoleic acid, linolenic acid, cyclohexane-carboxylic acid, phenylacetic acid, benzoic acid, o-toluic acid, m-toluic acid, p-toluic acid, o-chlorobenzoic acid, m-chlorobenzoic acid, p-chlorobenzoic acid, o-bromobenzoic acid, m-bromobenzoic acid, p-bromobenzoic acid, salicylic acid, p-hydroxybenzoic acid, anthranilic acid, o-methoxybenzoic acid, m-methoxybenzoic acid and p-methoxybenzoic acid. Preferred monocarboxylic acid starting materials are formic acid, acetic acid, propionic acid and benzoic acid.

A second general class of suitable amide hydroxy compounds includes the products of the reaction of esters, such as the ester cognates of the aforementioned monocarboxylic acids, with aminoalcohols. Of these esters methyl formate, ethyl acetate and [methyl-2-ethyl] *methyl 2-ethyl*-hexanoate are preferred. Other suitable esters include dicarboxylic acid esters such as dimethyl adipate.

Suitable aminoalcohol compounds for reaction with the aforementioned monocarboxylic acids, their ester cognates and other esters to form amide hydroxy containing intermediates, include ethanolamine, diethanolamine, N-methylethanolamine, N-ethylethanolamine, N-phenylethanolamine, 2-amino-1-butanol, 4-amino-1-butanol, 2-amino-2-ethyl-1,3-propanediol, 6-amino-1-hexanol, 2-amino-2(hydroxymethyl)-1,3-propanediol, 2-amino-3-methyl-1-butanol, 3-amino-3-methyl-1-butanol, 2-amino-4-methyl-1-pentanol, 2-amino-2-methyl-1,3-propanediol, 2-amino-2-methyl-1-propanol, 5-amino-1-pentanol, 3-amino-1,2-propanediol, 1-amino-2-propanol, 3-amino-1-propanol and hydroxyalkyl anilines like p-amino-benzyl alcohol. Preferred aminoalcohols are ethanolamine, diethanolamine and N-methylethanolamine.

A third case of amide hydroxy compounds includes the reaction products of a hydroxy carboxylic acid and a compound containing at least one primary or secondary amino nitrogen. Suitable hydroxy acids include $\alpha$-hydroxy acids such as hydroxyacetic acid, $\alpha$-hydroxypropionic acid and $\alpha$-hydroxyisobutyric acid, $\beta$-hydroxy acids such as ethyl $\beta$-hydroxybutric acid, $\gamma$-hydroxy acids such as $\gamma$-hydroxyvaleric acid, and aromatic hydroxy acids such as mandelic acid. Also suitable is the hydroxy acid prepared from the reaction of phthalic anhydride and diethylene glycol. Preferred hydroxy acids are hydroxyacetic acid and 2,2-bis(hydroxymethyl)propionic acid.

An appropriate class of compounds reactable with the aforementioned hydroxy acids, which compounds contain at least one primary or secondary amino nitrogen, may be drawn from such groups of compounds as aminoalcohols, aminolactams, aliphatic mono- or polyamines and aromatic mono- or polyamines. Suitable aminoalcohols include those set forth above for reaction with the aforementioned monocarboxylic acid or carboxylic acid ester starting materials. Examples of suitable aliphatic, cyclic and aromatic amines having at least one labile hydrogen on the nitrogen atom are methylamine, ethylamine, isopropylamine, n-butylamine, hexylamine, neoheptylamine, 2-ethyl-hexylamine, decylamine, aminomethyltrimethoxysilane, aminoethyltriethoxysilane, aminoethyltributoxysilane, aminobutyltriethoxysilane, aminopentyltriethoxysilane, aniline, tolylamine, xylylamine, naphthylamine, benzylamine, phenethylamine, cyclopentylamine, methylcyclopentylamine, cyclohexylamine, dimethylcyclohexylamine, dimethylamine, diethylamine, diisopropylamine, dibutylamine, dioctylamine, morpholine, tetrahydrofurfurylamine, piperazine, 2-methylpiperazine, N-methylpiperazine, N-propylpiperazine, piperidine, 2-ethylpiperdine, [4,4'-dipiperidyl-1, 3-di(4-piperidyl)propane] *4,4'-dipiperidyl, 1,3-di(4-piperidyl)propane*, 1,5-di(4-piperidyl)pentane, and the like. Polyamines are also useful as starting materials to form the amide hydroxy intermediate provided that the polyamine has at least one labile hydrogen on an amino nitrogen atom. Examples of suitable polyamines are [polyoxyalkylamines] *polyoxyalkyleneamines* sold by Jefferson Chemical Co. under the trademark Jeffamine ®.

A fourth general class of suitable amide hydroxy compounds includes reaction products of an inner ester of a hydroxy carboxylic acid and ammonia or a compound containing at least one primary or secondary amino nitrogen. Useful inner esters of carboxylic acids are lactones, such as $\gamma$-butyrolactone, $\gamma$-valerolactone, $\delta$-valerolactone and $\epsilon$-caprolactone. Examples of suitable compounds having a primary or secondary amino nitrogen may be found among the general classes of mono- and diamines. Suitable monoamines are those amines set forth above for reaction with the aforementioned carboxylic acids. A particularly preferred member of this general class of starting materials is the reaction product of $\gamma$-butyrolactone and ethanolamine. This preferred reaction product may be prepared by mixing together equimolar amounts of $\gamma$-butyrolactone and ethanolamine and heating the mixture to about 190° C. for 24 to 36 hours. The reaction product comprises a hydroxy-substituted lactam identified as N(2-hydroxyethyl)pyrrolidone. Diamines may also be reacted with one of the aforementioned lactones to form low molecular weight amide hydroxy compounds. Suitable diamines include 1,4-diaminobutane, 1,2-diaminocyclohexane, 1,10-diaminodecane, 1,12-diaminododecane, 1,6-diaminohexane, 1,5-diaminopentane, 1,8-diaminooctane, 1,2-diamino-2-methylpropane, 1,2-diaminopropane, 1,3-diaminopropane, 1,7-diaminoheptane, piperazine and the like.

A fifth class of suitable amide hydroxy compounds includes the reaction products of a lactide and a compound containing at least one amine nitrogen that has one or more active hydrogen atoms. Suitable lactides include dilactones formed from the self-esterification of an alpha-hydroxy acid. A typically useful lactide is the self-esterification product formed from two moles of lactic acid. Useful amino nitrogen-containing reactants include ammonia and those compounds set forth above for making the fourth class of amide hydroxy compounds.

A sixth class of suitable amide hydroxy compounds is provided by polyamide polyols. Polymeric amides result from the condensation reaction of diamines with diacids as is conventionally known. Preferred polyamides are those made from reacting saturated polycarboxylic acids with diamines. Examples of useful saturated polycarboxylic acids are oxalic acid, malonic acid, succinic acid, methylsuccinic acid, 2,2-dimethylsuccinic acid, 2,3-dimethylsuccinic acid, hexylsuccinic acid, glutaric acid, 2-methylglutaric acid, 3-methylglutaric acid, 2,2-dimethylglutaric acid, 3,3-dimethylglutaric acid, 3,3-diethylglutaric acid, adipic acid, pimelic acid, suberic acid, azelaic acid, sebaccic acid, phthalic acid, isophthalic acid, terephthalic acid, tetrachlorophthalic acid, 1,2-hexahydrophthalic acid, 1,3-hexahydrophthalic acid, 1,4-hexahydrophthalic acid, 1,1-cyclobutanedicarboxylic acid and trans-1,4-cyclohexanedicarboxylic acid. Suitable diamines include those diamines set forth above for reaction with a lactone in the fourth class of amide hydroxy compounds.

In order to provide the essential hydroxyl functionality in the aforementioned polyamides, it may be necessary to react the polyamides with either hydroxy-containing acids or hydroxy-containing amines, depending on whether an excess of amine or acid monomer is used in making the polyamide. Examples of hydroxy-acids include lactic acid, glycolic acid, hydroxy butyric acid, hydroxy stearic acid, recinoleic and the like. Suitable hydroxy-containing amines are aminoalcohols such as 2-aminoethanol, 2-amino-1-butanol, 4-amino-1-butanol, 2-(2-aminoethylamino)-ethanol, 2-amino-2-ethyl-1,3-propanediol, 6-amino-1-hexanol, 2-amino-2-(hydroxymethyl)-1,3-propanediol, 2-amino-3-methyl-1-butanol, 3-amino-3-methyl-1-butanol, 2-amino-4-methyl-1-pentanol, 2-amino-2-methyl-1,3-propanediol, 2-amino-2-methyl-1-propanol, 5-amino-1-pentanol, 3-amino-1,2-propanediol, 1-amino-2-propanol, 3-amino-1-propanol, 2-(3-aminopropylamino)-ethanol, and the like.

Preferred polyamide polyols include polyester amide prepared from ethylene glycol, ethanolamine and adipic acid, and polyester amide prepared from ethylene glycol, ethanolamine and azelaic acid. Other preferred classes of polyamide polyols include polyols derived from carboxyl or amine terminated polyamide in which the terminal carboxyl or amine groups are reacted with an alkylene oxide such as ethylene oxide or propylene oxide. Especially preferred of these is poly(hexamethylene adipamide).

Another preferred class of polyamide polyols may be prepared from the condensation reaction of a polyamine and a polycaprolactone polyol. Suitable polyamines include the diamines and polyalkylamines set forth as starting materials in the aforementioned classes of amide hydroxy compounds. Suitable polycaprolactone polyols are those sold by Union Carbide Corp. under the trade designation "PCP 0200".

The polyisocyanate compounds useful for making amide urethane acrylate compound of the invention include ethylene diisocyanate, 1,2-diisocyanatopropane, 1,3-diisocyanatopropane, 1,6-diisocyanatohexane, trimethylhexamethylene diisocyanate, 1,2-diisocyanatocyclohexane, 1,3-diisocyanatocyclohexane, 1,4-diisocyanatocyclohexane, 1,2-diisocyanatododecane, o-diisocyanatobenzene, m-diisocyanatobenzene, p-diisocyanatobenzene, bis(4-isocyanatocyclohexyl)methane, bis(4-isocyanatophenyl)methane, toluene diisocyanate (which commercially is a mixture comprising about 80 percent 2,4-diisocyanatotoluene and about 20 percent 2,6-diisocyanatotoluene), 3,3'-dichloro-4,4'-diisocyanatobiphenyl, tris(4-isocyanatophenyl)methane, 1,5-diisocyanatonaphthalene, hydrogenated toluene diisocyanate, 1-isocyanatomethyl-5-isocyanato-1,3,3-trimethylcyclohexane, and 1,3,5-tris(6-isocyanatohexyl)-biuret. Also included are polyisocyanates in a blocked form such as phenyl-blocked toluene diisocyanate and phenyl-blocked diisocyanatonaphthalene.

The third component for making the reaction product of the invention is a polyfunctional compound having at least one functional group which is reactive with an isocyanato group of the aforementioned polyisocyanate compound. It is further required that the polyfunctional compound provide at least one ethylenic functional group in the reaction product. Usually, the functional group of the polyfunctional compound reactive with the isocyanato group is a hydroxyl group, while the ethylenic group is furnished by an acrylate moiety. Representative examples of these polyfunctional compounds include hydroxy-containing acrylic monomers, such as 2-hydroxyethyl acrylate, 2-hydroxypropyl acrylate, 3-hydroxypropyl acrylate, 2-hydroxyethyl methacrylate, 2-hydroxypropyl methacrylate, 3-hydroxypropyl acrylate, 3-hydroxypropyl methacrylate, 4-hydroxybutyl acrylate; and halogenated hydroxyalkyl acrylates such as 3-chloro-2-hydroxypropyl acrylate, 3-chloro-2-hydroxypropyl methacrylate, 3-bromo-2-hydroxypropyl acrylate, 3-bromo-2-hydroxypropyl methacrylate, 2-chloro-1-(hydroxymethyl)ethyl acrylate, 2-chloro-1-(hydroxymethyl)ethyl methacrylate, 2-bromo-1-(hydroxymethyl)ethyl acrylate and 2-bromo-1-(hydroxymethyl)ethyl methacrylate.

Other useful polyfunctional compounds include allylic alcohols as a class.

The reaction product of the invention may be derived by using only one of the aforementioned polyfunctional compounds or it may be derived from a mixture of more than one compound. The preferred compounds are the hydroxyalkyl acrylic monomers. Especially preferred are 2-hydroxyethyl acrylate and 2-hydroxypropyl acrylate.

In addition to the three major components required for preparing the radiation polymerizable compound of the invention, there may be additional optional components reactable with the major components to form useful reaction products. A fourth component may be a hydroxyfunctional compound, typically a polyol, of low to high molecular weight. The polyol component is useful for modifying the viscosity of the amide urethane acrylate compound by increasing the molecular weight of the reaction product without inhibiting its high cure rate or the physical strength properties of cured films. The polyol generally has a number of hydroxy functional groups sufficient to react with only a portion of the reactive isocyanato groups of the polyisocyanate to form urethane groups in the reaction product. Thus, the reaction product may contain a urethane group attached to the residue of the reaction of an amide hydroxy compound with a polyisocyanate and the residue of the reaction of a polyol with a polyisocyanate.

Suitable classes of molecuar weight building polyols having two or more hydroxy functional groups are polyester polyols, simple alkyl diols and triols, polyether polyols and polyoxyalkylene polyols.

Examples of polyester polyols are the esterification reaction products of a saturated or unsaturated polycarboxylic acid and an excess of polyhydric alcohol. Suitable saturated polycarboxylic acids are set forth above as starting materials for making polyamide polyols. The ethylenically unsaturated polycarboxylic acids include maleic acid, fumaric acid, aconitic acid, itaconic acid, citraconic acid, mesaconic acid, muconic acid and dihydromuconic acid and halo and alkyl derivatives of such acids. Mixtures of ethylenically unsaturated polycarboxylic acids may be used or only a single such acid may be employed. The anhydrides of these acids, where the anhydrides exist, are, of course, embraced by the term "acid", since the polyesters obtained therefrom are essentially the same whether the acid or anhydride is used in the reaction.

One or more saturated polycarboxylic acids may optionally be utilized in combination with the ethylenically unsaturated acid or anhydride in the preparation of unsaturated polyesters. Such acids, especially the saturated dicarboxylic acids, increase the length of the polyester without adding additional crosslinking sites, which is a desired feature in some polyesters. Saturated tricarboxylic acids and saturated acids of higher carboxylic functionality may be used to provide branching where this is desirable.

The polyhydric alcohols useful in preparing ethylenically unsaturated polyesters include saturated polyhydric alcohols such as ethylene glycol, 1,3-propanediol, propylene glycol, 2,3-butanediol, 1,4-butanediol, 2-ethylbutane-1,4-diol, 1,5-pentanediol, 1,6-hexanediol, 1,7-heptanediol, 1,8-octanediol, 1,9-nonanediol, 1,10-decanediol, 1,9-decanediol, 1,4-cyclohexanediol, 1,4-dimethylolcyclohexane, 2,2-diethylpropane-1,3-diol, 2,2-dimethylpropane-1,3-diol, 3-methyl-pentane-1,4-diol, 2,2-diethylbutane-1,3-diol, 4,5-nonanediol, diethylene glycol, triethylene glycol, dipropylene glycol, neopentyl glycol, glycerol, pentaerythritol, erythritol, sorbitol, mannitol, 1,1,1-trimethylolpropane, trimethylolethane, and 2,2-dimethyl-3-hydroxypropyl 2,2-dimethyl-3-hydroxypropionate. Ethylenically unsaturated polyhydric alcohols such as 2-butene-1,4-diol may be used alone or in admixture with the saturated polyhydric alcohols. Of course, mixtures of saturated polyhydric alcohols or mixtures of unsaturated polyhydric alcohols may be employed.

In addition to the aforementioned polyhydric alcohols, suitable polyesters may also be formed from reaction of the mentioned dicarboxylic acids with thioether diols such as thiodiethanol or a thioether diol made from reaction of 4,4'-dihydroxydiphenyl sulphide with propylene oxide.

The polyesters derived from reaction of the aforementioned polycarboxylic acids and polyhydric alcohols should have reactive hydroxy functionality in sterically unhindered positions on the polyester backbone. Often, such hydroxy functionality is located in terminal positions. This may be achieved by reacting a molar excess of the alcohol with a carboxyl-terminated acid; or the hydroxy functionality may be introduced by capping the polyester with a di- or higher polyfunctional alcohol which is usually chosen from the aforementioned group of polyhydric alcohols. Other capping compounds for carboxyl-terminated polyesters include epoxides, such as ethylene oxide and propylene oxide, epihalohydrins such as epichlorohydrin and epibromohydrin, and the triglycerides of epoxidized fatty oils such as epoxidized linseed oil, safflower oil and soybean oil.

Preferred polyester polyols made from reactants described include poly(hexamethylene adipate), poly(1,4-butylene adipate), poly(ethylene phthalate) and poly(ethylene maleate). Another class of preferred polyester polyols includes polycaprolactone polyols made from polymerization of caprolactone with various diols or higher polyols. Especially preferred are those poly(caprolactone) polyols having molecular weights in the range of about 500 to 900 and hydroxy values of about 180 to 220.

Examples of useful simple alkyl diols and triols as molecular weight building components are the polyhydric alcohols set forth above for preparation of the polyester polyols. Useful polyether polyols are those prepared from the polymerization of aldehydes, alkylene oxides, or glycols by known methods. For example, formaldehyde, ethylene oxide, propylene oxide, epichlorohydrin and the like may addition polymerize to form polyether diols under appropriate conditions. Preferred polyether polyols include the class comprising polyalkyleneoxide polyols. Especially preferred are polypropylene glycol, polyethylene glycol and polybutylene glycol.

The amide urethane acrylate compound of the invention may be generally prepared by mixing together one or more of each of the aforementioned hydroxy group containing amide compound, polyisocyanate and polyfunctional compound and allowing the mixture to react for a period of time sufficient to form the reaction product. Or, an amide-hydroxy compound and a polyisocyanate may be reacted to form an amide urethane intermediate having at least one terminal isocyanato group; then the intermediate is reacted with the hydroxy acrylate compound. Or, the polyisocyanate may be reacted with the polyfunctional compound to form a urethaneacrylate intermediate containing at least one terminal isocyanato group; then the intermediate is reacted with an amide-hydroxy compound to form the reaction product. Preferably, the reaction product is formed by firstly preparing an amide-hydroxy intermediate, then secondly adding the intermediate gradually to the polyisocyanate to form an NCO-terminated amide urethane, and thirdly adding the polyfunctional compound gradually to the amide urethane to form an amide urethane acrylate.

Whether all the components are mixed together at once or the components are added together to form intermediates, the equivalent weight ratios of amidehydroxy compound to polyisocyanate to polyfunctional compound are generally in the range of 1:1.25:0.25 to 1:2:1, and more usually the range of equivalent weight ratios is 1:1.5:0.65 to 1:2:1, although significantly lower amounts of the NCO-containing component may be used. An excess of the polyfunctional component is not at all harmful inasmuch as this component, especially when it is one of the aforementioned hydroxy-acrylate compounds, constitutes a reactive diluent for the reaction product.

Where it is desired that the amide urethane acrylate compound be prepared with a molecular weight building polyol component, the polyol may be reacted with the polyisocyanate in the reaction vessel containing the amide hydroxy and polyisocyanate components; or the reactions may be carried out in separate vessels, and then the NCO-terminated amide urethane intermediate and the NCO-terminated polyol-residue urethane intermediate may be mixed together and further reacted with the polyfunctional compound. It is preferred that a blend of the amide hydroxy component and the polyol component be added gradually to the polyisocyanate to form a mixture of amide urethane and polyol-residue urethane intermediates.

It is usually desired that the total hydroxy functional group equivalent weight contributed by the amide hydroxy component and the polyol component be somewhat less than the equivalent weight of reactive isocyanato groups so as to provide NCO reaction sites for the polyfunctional compound.

The amide urethane acrylate compound may constitute the only major component of a coating composition or it may be used as an additive to coating compositions containing other radiation polymerizable components. Typical of these components are polyester, polyurethane and polyamide materials having ethylenically unsaturated groups capable of undergoing addition polymerization in the presence of actinic light of ionizing radiation.

Thus, the amide urethane acrylate may be present in coating compositions in an amount from about 0.1 percent to about 99 percent by weight of the total composition. More often the compound is present in a range of about 20 to 80 percent. A coating composition may contain the amide urethane acrylate compound alone in a diluent, although other components are usually present. The diluent may be of the volatile, non-reactive type like toluene, xylene or methylene chloride, but is preferred to be of the substantially non-volatile, reactive type such as the classes of compounds of monoacrylate and methacrylate esters, diacrylates, acrylamides and heterocyclic vinyl compounds such as N-vinyl pyrrolidone. When the reaction product and a reactive diluent make up the composition, the diluent is usually present in an amount in the range of about 10 to 60 total weight percent, and preferably in the range of about 10 to 20 weight percent.

Examples of preferred radiation polymerizable components which may serve as coreactive diluents are mono- and polyacrylic functional monomers such as methyl acrylate, methyl methacrylate, ethyl acrylate, ethyl methacrylate, propyl acrylate, propyl methacrylate, butyl acrylate, butyl methacrylate, hexyl acrylate, hexyl methacrylate, octyl acrylate, octyl methacrylate, neopentyl glycol diacrylate, ethylene glycol diacrylate, diethylene glycol diacrylate, triethylene glycol diacrylate and tetraethylene glycol diacrylate.

When the coating composition is to be cured by exposure to ultraviolet light, photoinitiator, photosensitizer or a mixture of photoinitiator and photosensitizer is usually present.

Photoinitiators are compounds which absorb photons and thereby obtain energy to form radical pairs, at least one of which is available to initiate addition polymerization of acrylic or methacrylic groups in the well-known manner. Photosensitizers are compounds which are good absorbers of photons, but which are themselves poor photoinitiators. They absorb photons to produce excited molecules which then interact with a second compound to produce free radicals suitable for initiation of addition polymerization. The second compound may be a monomer, a polymer or an adder initiator. Examples of photoinitiators are benzoin, methyl benzoin ether, butyl benzoin ether, isobutyl benzoin ether, $\alpha,\alpha$-diethoxyacetophenone and $\alpha$-chloroacetophenone. Examples of photosensitizers are benzil, 1-naphthaldehyde, anthraquinone, benzophenone, 3-methoxybenzophenone, benzaldehyde, diethoxyacetophenone and anthrone.

The amount of photoinitiator, photosensitizer or mixture of photoinitiator and photosensitizer present in the radiation curable coating composition can vary widely. When any of these materials are present, the amount is usually in the range of from about 0.01 to about 10 percent by weight of the radiation curable components of the coating composition. Most often the amount is in the range of from about 0.1 to about 5 percent by weight. When the coating is to be cured by exposure to ionizing radiation, these materials are usually omitted from the coating composition, although their presence is permissible.

While the preferred method for effecting addition polymerization of the film-forming compounds of the invention is by subjecting the compound to an effective dose of ionizing or actinic radiation, other means and methods may be employed to obtain the desired cross-linked film. For example, addition polymerization may be accomplished by the presence of thermally-sensitive catalysts or initiators which are capable of generating free radicals that may initiate addition polymerization of the amide urethane acrylate compound of the invention. Typical initiators include benzoyl peroxide and azo bis(isobutyronitrile).

Extender pigments may be present in the composition, and when ultraviolet light is used to cure the film, it is preferred that the extender pigment be substantially transparent to ultraviolet light. Examples of ultraviolet light transparent extender pigments are silica, calcium carbonate, barium sulfate, talc, aluminum silicates, sodium aluminum silicates and potassium aluminum silicates.

Hiding and/or coloring pigment may optionally be present. When the pigment is of the ultraviolet light absorbing type and the coating composition is to be cured by exposure to ultraviolet light, the pigment should be used in amounts which do not preclude curing of the interior of the coating. Examples of hiding pigments are titanium dioxide, antimony oxide, zirconium oxide, zinc sulfide and lithopone. Examples of coloring pigments are iron oxides, cadmium sulfide, carbon black, phthalocyanine blue, phthalocyanine green, indanthrone blue, ultramarine blue, chromium oxide, burnt umber, benzidine yellow, toluidine red and aluminum powder. Individual pigments or mixtures of hiding and/or coloring pigments may be used.

Mixtures of extender pigments, hiding pigments and/or coloring pigments may also be employed.

Dyes in their customarily used amounts may be present in the coating composition.

Although not ordinarily desired, minor amounts, usually in the range of from about 0.1 to about 20 percent by weight of the total weight of the composition of volatile reactive solvent and/or inert volatile organic organic solvent may be present in the radiation curable coating composition.

Various additional materials may be added to adjust the viscosity of the coating compostion. Examples of such materials are fumed silica, castor oil based compositions (e.g., Thixatrol ST, Baker Castor Oil Company), modified clays, 12-hydroxystearic acid, tetrabutyl orthotitanate and micro-crystalline cellulose. When used, these materials are usually present in an amount in the range of from about 0.5 percent to about 15 percent by weight of the radiation curable components.

The radiation curable coating compositions of the invention are usually prepared by simply admixing the solution of the amide urethane acrylate compound dissolved in reactive solvent with such other ingredients as may be present. Although mixing is usually accomplished at room temperature, elevated temperatures are sometimes used. The maximum temperature which is usable depends upon the heat stability of the ingredients. Temperatures above about 120° C. are only rarely employed.

The radiation curable coating compositions are used to form cured adherent coatings on substrates. The substrate is coated with the coating composition using substantially any technique known to the art. These include spraying, curtain coating, dipping, direct roll coating, reverse roll coating, painting, brushing, printing, drawing and extrusion. The coated substrate is then exposed to radiation to sufficient intensity for a time sufficient to crosslink the coating. The times of exposure to radiation and the intensity of the radiation to which the coating composition is exposed may vary greatly. Generally, the exposure to radiation should continue until the C-stage is reached when hard, solvent resistant films result. In certain applications, however, it may be desirable for the curing to continue only until the B-stage, viz., gel stage, has been obtained.

Substrates which may be coated with the compositions of this invention may vary widely in their properties. Organic substrates such as wood, fiberboard, particle board, composition board, paper, paper board, cardboard and various polymers such as polyesters, polyamides, cured phenolic resins, cured aminoplasts, acrylics, polyurethanes and rubber may be used. Inorganic substrates are exemplified by glass, quartz and ceramic materials. Many metallic substrates may be coated. Exemplary metallic substrates are iron, steel, stainless steel, copper, brass, bronze, aluminum, magnesium, titanium, nickel, chromium, zinc and alloys. Especially suitable substrates are vinyl overlay coverings which are typically bonded to furniture and other articles. The amide urethane acrylate compositions are particularly useful for coating floor coverings such as tile, asbestos-tile, or linoleum-like coverings, and such flexible substrates as wall-base coving. These substrates are made from or comprise vinyl-containing polymerizable compositions such as vinyl chloride, vinyl acetate, vinyl fluoride, vinylidene chloride and copolymerizable combinations of said vinyl-containing compounds with ethylene or propylene.

Cured film coatings of the radiation curable coating compositions usually have thicknesses in the range of from about 0.001 millimeter to about 3 millimeters. More often they have thicknesses in the range of from about 0.002 millimeter to about 0.3 millimeter, and most preferred are coatings ranging from 0.002 millimeter to 0.08 millimeter. When the radiation curable coating composition is a radiation curable printing ink, the cured coatings usually have thicknesses in the range of from about 0.001 millimeter to about 0.003 millimeter.

The coatings of this invention may be cured by exposure to ionizing radiation, the unit of dose of ionizing radiation being the "rad" which is equal to 100 ergs of energy absorbed from ionizing radiation per gram of material being irradiated. As used throughout the specification, dose is referenced to the bleaching of calibrated blue cellophane film irrespective of the identity of the coating composition being irradiated.

The coatings of this invention may also be cured by exposure to actinic light. Actinic light, as used herein, is electromagnetic radiation having a wavelength of 700 nanometers or less which is capable of producing, either directly or indirectly, free radicals capable of initiating addition polymerization of the coating copositions of the invention. Usually photoinitiator, photosensitizer or mixtures of photoinitiator and photosensitizer are present to absorb photons and produce the free radicals, although in some cases, these materials are not needed. Actinic light possesses insufficient energy to produce ions in a medium composed of common elements such as air or water and hence, has an energy below about 10 electron volts. The most commonly used form of actinic light is ultraviolet light, viz., electromagnetic radiation having a wavelength in the range of from about 180 nanometers to about 400 nanometers, although actinic light or greater or shorter wave-length may also be used effectively.

Any suitable source which emits ultraviolet light may be used in the practice of this invention. Suitable sources are set forth in U.S. Pat. No. 4,017,652 to G. W. Gruber.

The times of exposure to actinic light and the intensity of actinic light to which the coating composition is exposed may vary greatly. In keeping with the general principles heretofore set forth, the exposure to actinic light should usually continue until the C-stage is obtained. However, for certain applications, the exposure may be stopped when the B-stage has been achieved.

The following examples setting forth specific reactant quantities and conditions, specify certain additives, such as catalysts, diluents and surfactants for preparation of the amide urethane acrylate compounds of the present invention. Unless otherwise indicated, all parts and percentages are by weight, and all viscosity values are from measurements from the Gardner-Holt viscosity scale. These embodiments are not to be construed, however, as limiting the invention since there are numerous variations and modifications possible.

EXAMPLE I

Into a reaction vessel equipped with an agitator, a heater, cooling means, a thermometer and refluxing condenser, there is charged 529 parts N-methylethanolamine. The amine is heated to about 99° C. With the temperature of the amine maintained at 96°–99° C., 615 parts γ-butyrolactone is added gradually to the reaction vessel, approximately 9 parts being added every minute. The temperature of the reaction mixture is maintained at 99°–102° C. for about six hours with periodic viscosity checks being made on 100 percent samples. A final viscosity of R is obtained after which the amide diol intermediate reaction product is cooled to about 52° C. and then placed in a storage container.

Into a reaction vessel equipped as above, there is charged 809 parts bis(4-isocyanatocyclohexyl)methane ("Hylene W"; DuPont), 618 parts 2-ethylhexyl acrylate, 0.48 part dibutyltin dilaurate ("Niax" catalyst; Union Carbide Corp.) and 0.05 part phenothiazine. An air sparge is applied below the surface of the reaction mixture and a nitrogen blanket is established above the mixture. The reaction mixture is heated from 21° C. to about 40° C. in a 55-minute period, after which time the nitrogen blanket and air sparge are removed. Then over a two hour period there is added to the reaction vessel a blend of 663 parts of a polycaprolactone polyol having a hydroxyl value of 216 (PCP 0200; Union Carbide Corporation) and 143 parts of the previously prepared amide diol intermediate. The temperature of the reaction mixture is observed to vary during the two-hour addition period from about 42° C. to about 52° C. The reaction mixture is held at about 52° C. for two hours, after which time a viscosity check is made on a sample of the reaction mixture diluted to 75 percent concentration in toluene and is found to be V+. The reaction mixture is then heated to about 63° C. and held at that temperature for one hour and 45 minutes, after which time a viscosity of V+ is obtained for a sample taken as before. The reaction mixture is heated to about 68° C. during a one hour and 5 minute holding period. Then a blend of 4.5 parts hydroxyethyl acrylate and 2.3 parts di-t-butyl-p-cresol ("Ionol" inhibiting agent; Shell Oil Company) is added to the reaction vessel. Over a 30-minute period 254 parts hydroxyethyl acrylate is added to the reaction mixture, after which time the temperature is observed to be 69° C. and a viscosity measurement of V+ is obtained for a sample taken as before. The reaction mixture is then maintained at 76°-76° C. for two hours and 45 minutes during which time viscosity measurements of V− and U+ are obtained. Then 24.5 parts glacial acrylic acid is added to the reaction mixture and after 45 minutes a viscosity of V+ is obtained for a sample diluted to 75 percent concentration in 2-ethoxyethanol. The amide urethane acrylate reaction product is cooled to about 52° C. and filtered through a nylon bag into a storage container.

To 50.0 parts of the previously prepared amide urethane acrylate reaction product is added 2.5 parts of a 60/40 mixture of benzophenone/diethoxyacetophenone photocatalyst system to form a coating composition. Three "Bonderite" 37Q steel test panels are manually coated with the composition using a 0.008 wire-bound draw-down bar to achieve a coating thickness of 0.2-0.3 mil. The coated panels pass once under a bank of four 200-watt per inch mercury vapor lamps spaced at a distance of about 3½ inches from the test panels which are transported under the lamps at conveyor speeds of 60, 80 and 100 feet per minute. The panels are then subjected to a fingernail mar test and to a methylethyl ketone double-rub test. Test results are reported in Table I.

TABLE I

| Conveyor Speed (Ft./Min.) | Mar-Resistance | Solvent Resistance (No. of Double Rubs) |
|---|---|---|
| 100 | Fair to good | 40 |
| 80 | Good | 65 |
| 60 | Good to very good | 95 |

EXAMPLE II

Into a reaction vessel equipped as in Example I, there is charged 360 parts bis(4-isocyanatocyclohexyl)methane, 244 parts 2-ethylhexyl acrylate and 0.14 part dibutyltin dilaurate. With the reaction mixture under slight agitation, there is added gradually over a two-hour period a blend of 220 parts polyoxybutylene having an average molecular weight of 630 and 59.5 parts of the amide diol intermediate reaction product prepared in Example I. Approximately 23.2 parts of the blend is added every 10 minutes during the addition period, with the temperature of the reaction mixture rising initially from about 17° C. to about 32° C. The reaction mixture is maintained at 50°-54° C. for two hours, then heated to about 66° C. and held at 66°-67° C. for two hours, after which time a viscosity measurement of G is obtained for a sample diluted to 75 percent concentration in toluene. After another one-hour holding period, the temperature of the reaction mixture of about 71° C. is observed and a viscosity measurement of G is obtained as before. Then a slurry consisting of 4.54 parts hydroxyethyl acrylate and 1.7 parts di-t-butyl-p-cresol is added quickly to the reaction mixture. Over a 30-minute period and with the temperature of the reaction mixture maintained at about 71° C., 168 parts hydroxyethyl acrylate is gradually added to the reaction vessel, approximately 28 parts of the acrylate being added every five minutes. After one hour with the temperature of the reaction mixture at about 76° C., a viscosity value of J is obtained as measured before. The temperature of the reaction mixture is then held for three more hours at 75°-79° C. with a final viscosity measurement of M being obtained on a sample diluted to 75 percent concentration in 2-ethoxyethanol. The amide urethane acrylate reaction product is cooled to about 40° C. and filtered through a nylon bag into a storage container.

To 50.0 parts of an amide urethane acrylate reaction product prepared as generally set forth above, there is added 0.75 part diethoxyacetophenone to form a rapidly curing coating composition. Commercially available, industrial grade vinyl asbestos tiles are manually coated with the composition using a 0.042 wire-wound draw-down bar to achieve a coating thickness of 2 to 2.5 mil. The coated test tiles are given a three second exposure to a "Chromalox" infrared heating element (rated 3200 watts/ft.$^2$) at a distance of about two inches from the tiles to promote flow of the coating composition over the test tiles. Then the tiles are exposed in a nitrogen atmosphere to a bank of two 200-watt per inch mercury vapor lamps spaced at a distance of about 3½ inches from the tiles which are transported under the lamps at 30 feet per minute. Uniformly glossy and surface-hard film coatings are obtained on each of the test tiles.

EXAMPLE III

Into a raction vessel equipped as in Example I, there is charged 150 parts N-methylethanolamine. Over a period of about one hour; 172 parts γ-butyrolactone is added dropwise to the reaction vessel with the temperature of the reaction mixture being maintained at about 100°-103° C. The reaction mixture is then maintained at about 100° C. for one hour, after which time an infrared analysis of the reaction product shows substantially no unreacted γ-butyrolactone in the amide diol intermediate reaction product.

Into another reaction vessel equipped as above, there are charged 532 parts bis(4-isocyanatocyclohexyl)methane, 284 parts methylethylketone and 0.5 part dibutyltin dilaurate. The mixture is heated to about 70° C. with agitation. Over a period of two hours and 10 minutes, a blend of 264.5 parts of a polycaprolactone polyol having a hydroxyl value of about 212 (PCP 0200; Union Carbide Corp.) and 168 parts of the previously prepared amide diol intermediate is added dropwise to the reaction mixture. At the end of the addition period, the temperature of the reaction mixture is observed to be about 80° C. Over a 30 minute period, a blend of 174 parts hydroxyethyl acrylate and 2 parts di-t-butyl-p-cresol is added dropwise to the reaction mixture which is maintained at a temperature of about 77° C. The reaction mixture is then held at about 77° C. for about one hour after which time a viscosity measurement of X+½ is obtained on a sample diluted to 75 percent concentration in 2-ethoxyethanol. An infrared analysis shows very little unreacted isocyanato group in the amide urethane acrylate reaction product.

A sample of the previously prepared amide urethane acrylate reaction product is diluted with ethyl acetate to give a coating composition comprising about 41 percent solvent. To 50 parts of the coating composition is added 0.5 part diethoxyacetophenone and 5 parts methylethylketone. Several electrolytic tin plate panels, previously wiped with acetone, are manually coated with the composition to an application thickness sufficient to achieve a cured-film thickness of about 2 mils. Then the coated panels are heated at about 52° C. for about 1½ hours to remove volatile solvent. The coated panels are then exposed to curing radiation in a nitrogen atmosphere by passing the panels twice under a bank of four 200 watt per inch mercury vapor lamps positioned about 3½ inches above a conveyor transporting the coated panels at 70 feet per minute. Hard, glossy, strippable film coatings are formed having tensile and elongation properties as reported in Table II.

EXAMPLE IV

Into a reaction vessel equipped as in Example I, there is charged 230 parts of a polyoxyethyleneamine (Jeffamine® D-230; Jefferson Chemical Co., Inc.). The amine is heated to about 80° C. and over a one-hour period 189.2 parts γ-butyrolactone is added dropwise to the reaction vessel. The reaction mixture is heated to about 100° C. and maintained at that temperature for about one hour and 40 minutes. Since infrared analysis of the reaction mixture shows carbonyl functional group indicating the presence of unreacted γ-butyrolactone in the mixture, 15 parts more of the polyoxyethyleneamine is added to the reaction vessel. The reaction vessel is allowed to stand overnight, then heated from 28° C. to about 60° C. in 30 minutes, and thereafter held at 55°-60° C. for about one hour. The reaction mixture is allowed to cool to 45° C. in 30 minutes after which time an infrared analysis shows unreacted γ-butyrolactone in the mixture. The reaction mixture is allowed to stand for three days and is then heated and held at about 100° C. for three hours, after which time 15 parts more of the polyoxyethyleneamine is added. The reaction mixture is heated two more hours at about 100° C., after which time a satisfactory infrared analysis is obtained showing substantially no unreacted γ-butyrolactone in the amide diol intermediate reaction product.

Into another reaction vessel, equipped as before, there are charged 532 parts bis(4-isocyanatocyclohexyl)methane, 368 parts methyl isobutyl ketone and 0.5 part dibutyltin dilaurate. The mixture is heated to about 40° C. Over a two-hour period, a blend of 529 parts of a polycaprolactone polyol (PCP 0200, Union Carbide Corp.) and 238 parts of the previously prepared amide diol intermediate reaction product is added dropwise to the reaction mixture. Then 210 parts methyl ethyl ketone is added to the reaction mixture. The reaction mixture is heated to about 60° C. in 25 minutes at which time 33 parts bis(4-isocyanatocyclohexyl)methane is added, with the temperature maintained thereafter at 60°-70° C. for one hour and 35 minutes. Then a blend of 174 parts hydroxyethyl acrylate and 2 parts di-t-butyl-p-cresol is added to the reaction mixture. After about two hours at 70°-75° C. the reaction mixture is cooled. A viscosity measurement of V+ is obtained for a sample of the amide urethane acrylate reaction product diluted to 75 percent concentration in 2-ethoxyethanol.

A sample of the previously prepared amide urethane acrylate reaction product is diluted with ethyl acetate to give a coating composition comprising about 41 percent solvent. To a 100 parts of the composition is added 0.5 part diethoxyacetophenone. Several electrolytic tin plate panels, previously wiped with acetone, are manually coated with the composition using three mil bird applicator bar to an application thickness sufficient to achieve a cured-film thickness of about 2 mils. Then the panels are heated at about 52° C. for about 1½ hours to remove volatile solvent. The coated panels are then exposed to curing radiation in a nitrogen atmosphere by passing the panels twice under a bank of four 200 watt per inch mercury vapor lamps spaced at a distance of about 3½ inches above a conveyor transporting the coated panels at 70 feet per minute. Strippable hard, glossy films are formed having tensile and elongation properties as reported in Table II.

EXAMPLE V

Into a reaction vessel equipped as in Example I there is charged 269 parts bis(4-isocyanatocyclohexyl)methane, 192 parts methyl ethyl ketone and 0.2 part dibutyltin dilaurate. A blend of 119 parts of the amide diol intermediate prepared in Example IV and 107 parts polypropylene glycol having an average molecular weight of about 440 is added dropwise to the reaction mixture over a period of two hours, with the temperature of the reaction mixture being maintained at about 36° C. The reaction mixture is heated to about 80° C. in 15 minutes, then maintained at that temperature for about 25 minutes, and thereafter allowed to cool and stand overnight. The reaction mixture is then heated and maintained at 78°-80° C. for about 2½ hours. To the reaction mixture is added 1 part di-t-butyl-p-cresol followed by the dropwise addition of 81.2 parts hydroxyethyl acrylate. The reaction mixture is then maintained at 75°-77° C. for about 4¾ hours. A sample of the amide urethane acrylate reaction product diluted to 75 percent concentration in 2-ethoxyethanol is observed to have a viscosity of N−.

Coating compositions are prepared by the addition of 0.5 part diethoxyacetophenone to 50 parts of the amide urethane acrylate reaction product. Tin-free steel test panels are coated with the composition to an application thickness sufficient to give a cured film thickness of about 5 mil. The coated panels are exposed to curing radiation by passing the panels twice under a bank of four mercury vapor lamps positioned at about 3½ inches from a conveyor transporting the panels at 70 feet per minute. After exposure to curing radiation and for the purpose of driving off residual solvent, the coated panels are baked at about 71° C. for three hours and then baked at about 49° C. for 18 hours. Strippable hard, glossy films are formed having tensile elongation properties as reported in Table II.

EXAMPLE IV

Into a reaction vessel equipped as in Example I, there is charged 75 parts N-methylethanolamine. Over a period of about one hour, 86 parts γ-butyrolactone is added dropwise to the reaction vessel with the temperature of the reaction mixture being maintained at about 100° C. The reaction mixture is then maintained at 100°-105° C. for about four hours, after which time the reaction mixture is allowed to stand overnight. Then after adding about 75 parts N-methylethanolamine to the reaction vessel, the reaction mixture is heated for three more hours at about 100° C. Infrared analysis indicates presence of unreacted γ-butyrolactone in the amide diol intermediate reaction product.

Into another reaction vessel equipped as before; there are charged 415 parts bis(4-isocyanatocyclohexyl)methane, 420 parts methylethylketone and 0.2 part dibutyltin dilaurate. The mixture is heated to about 40° C. with agitation. Over a two-hour period, a blend of 397 parts of a polycaprolactone polyol (PCP 0200; Union Carbide Corp.) and 92 parts of the previously prepared reaction product is added dropwise to the reaction mixture. The temperature of the reaction mixture is then maintained at about 80° C. for about 20 minutes, after which time the reaction is allowed to cool and stand for about 41 hours. The reaction mixture is heated to about 80° C. in 50 minutes, and then over a 30 minute period, a blend of 85 parts hydroxyethyl acrylate and 2 parts di-t-butyl-p-cresol is added dropwise to the reaction mixture. The reaction mixture is then held at about 80° C. for one hour and 40 minutes after which time an infrared analysis of the reaction product shows very little unreacted isocyanato group in the amide urethane acrylate product. A viscosity measurement of $Y^-$ is obtained on a sample of the reaction product diluted to 75 percent concentration in 2-ethoxyethanol.

A urethane acrylate resin devoid of amide groups is prepared for comparative testing purposes. Into another reaction vessel equipped as before, there are charged 332.5 parts bis(4-isocyanatocyclohexyl)methane, 243 parts methylethylketone and 0.1 part dibutyltin dilaurate. The mixture is heated to about 50° C. and over a period of about three hours, 529 parts of a polycaprolactone polyol having a hydroxyl value of about 212 (PCP0200; Union Carbide Corp.) is added dropwise to the reaction mixture. The reaction mixture is heated about 65° C. and maintained at that temperature for about 1½ hours. Then over a period of about 40 minutes, a blend of 116 parts hydroxyethyl acrylate and 1 part di-t-butyl-p-cresol is added dropwise to the reaction mixture, after which the temperature of the reaction mixture is observed to be about 68° C. The reaction mixture is allowed to cool and stand overnight. Then the mixture is heated to 67°-68° C. and held at that temperature for about 40 minutes. A viscosity measurement of $Z1^+$ is obtained for a sample of the urethane acrylate reaction product diluted to 75 percent concentration with 2-ethoxyethanol.

Coating compositions are prepared by the addition of 0.5 part diethoxy-acetophenone to 50 parts of each of the amide urethane acrylate and urethane acrylate reaction products. Samples of each coating composition are applied to tin-free steel test panels to an application thickness sufficient to provide a cured film thickness of 2 to 4 mil. Some of the test panels coated with amide urethane acrylate composition and all of the urethane acrylate coated panels are subjected to an infrared pre-treatment to promote levelling of the uncured film coating on the test panels by baking the coated panels for 1½ hours at about 49° C. Amide urethane acrylate and urethane acrylate coated panels subjected to the aforementioned pre-treatment are designated as cured by Method "B", while the other amide urethane acrylate coated panels not subjected to pre-treatment are designated as cured by Method "A". All of the coated test panels are then exposed to curing radiation by passing the panels twice under a bank of four mercury vapor lamps positioned 3½ inches from a conveyor transporting the panels at 70 feet per minute. After exposure to curing radiation, the amide urethane acrylate coated panels of Method "A" (but not the amide urethane acrylate coated panels of Method "B", nor the urethane acrylate coated panels), are baked at about 71° C. for three hours and then at about 49° C. for 18 hours to drive off residual volatile solvent. Data as to comparative physical properties of film coatings made from the urethane acrylate and amide urethane acrylate reaction products are set forth in Table II.

TABLE II

| Example | Resin Reaction Product | Average Cured Film Thickness (mil) | Average Tensile Strength (p.s.i.)* | Average Elongation (%)* | Number of Replicates |
|---|---|---|---|---|---|
| III | Amide Urethane Acrylate | 2.15 | 4678 | 78 | 2 |
| IV | Amide Urethane Acrylate | 3.5 | 3263 | 201 | 4 |
| V | Amide Urethane Acrylate | 5.0 | 3616 | 55 | 3 |
| VI | Urethane Acrylate | 2.78 | 2133 | 327 | 2 |
| Meth. A | Amide Urethane Acrylate | 3.6 | 4177 | 353 | 5 |
| Meth. B | Amide Urethane Acrylate | 2.0 | 4369 | 285 | 4 |

*Tested according to ASTM Method D 683-72.

Although specific examples of the instant invention have been set forth hereinabove, it is not intended that the invention be limited solely thereto, but is to include all the variations and modifications falling within the scope of the appended claims.

What is claimed:

1. Addition polymerizable compound having [at least] one *or two* amide [group] *groups*, at least [one] *three* urethane [group] *groups* and at least one [ethylenically unsaturated functional] *acrylate or methacrylate* group comprising the reaction product of [the] components [of] *comprising:*

(a) an amide-containing compound [having] *which contains one or two amide groups and* at least one NCO-reactive hydroxy functional group;

(b) a polyisocyanate *which is a diisocyanate or a triisocyanate;* [and]

(c) a polyfunctional compound [containing at least one functional group reactive with an isocyanato group of said polyisocyanate and] which [polyfunctional compound] provides at least one [ethylenically unsaturated functional] *acrylate or methacrylate* group in said reaction product, *said polyfunctional compound being a hydroxy-containing ester of acrylic acid or a hydroxy-containing ester of methacrylic acid; and*

*(d) polyol selected from the group consisting of polyester polyol and polyether polyol.*

2. The addition polymerizable compound of claim 1, wherein said amide-containing compound [having at least one hydroxy functional group] is selected from the group consisting of (a) a reaction product of a monocarboxylic acid and an aminoalcohol;

(b) a reaction product of an ester of a carboxylic acid and an aminoalcohol;

(c) a reaction product of a hydroxy carboxylic acid and a compound containing [at least] one *or two* amino [nitrogen] *nitrogens*;

(d) a reaction product of a lactone and ammonia or a compound containing [at least] one *or two* amino [nitrogen] *nitrogens*; and (e) a reaction product of a lactide and ammonia or a compound containing [at least] one *or two* amino [nitrogen] *nitrogens*.

[3. The addition polymerizable compound of claim 1, wherein said amide-containing compound having at least one hydroxy functional group is a polyamide polyol.]

4. The addition polymerizable compound of claim [2] *1*, wherein said *amide-containing compound is a reaction product of (a) a* monocarboxylic acid [is] selected from the group consisting of formic acid, acetic acid, propionic acid and benzoic acid *and (b) an aminoalcohol.*

5. The addition polymerizable compound of claim [2] *1*, wherein said *amide-containing compound is a reaction product of (a) an* ester of a carboxylic acid [is] selected from the group consisting of methyl formate, ethyl acetate, dimethyl adipate and [methyl-2-ethyl hexanoate] *methyl 2-ethylhexanoate and (b) an aminoalcohol.*

6. The addition polymerizable compound of claim [2] *1*, wherein said *amide-containing compound is a reaction product of (a) a* hydroxy carboxylic acid [is] *selected from the group consisting of* hydroxyacetic acid, 2,2-bis(hydroxymethyl)propionic acid [or] *and* an aromatic hydroxy acid prepared from the reaction of phthalic anhydride and diethylene glycol *and (b) a compound containing one or two amino nitrogens.*

7. The addition polymerizable compound of claim [2] *1*, wherein said *amide-containing compound is a reaction product of (a) a* lactone [is] selected from the group consisting of γ-butyrolactone, γ-valerolactone, δ-valerolactone and ε-caprolactone *and (b) a compound containing one or two amino nitrogens.*

8. The addition polymerizable compound of claim [2] *6 or 7*, wherein said compound containing [at least] one *or two* amino [nitrogen] *nitrogens* is selected from the group consisting of aminoalcohol, aliphatic mono- or [polyamine] *diamine*, aromatic mono- or [polyamine] *diamine* and cyclic mono- or [polyamine] *diamine.*

9. The addition polymerizable compound of claim [8] *4 or 5*, wherein said aminoalcohol [that is reactable with one of said carboxylic acid, carboxylic acid ester, hydroxy carboxylic acid, lactone and lactide] is selected from the group consisting of ethanolamine, diethanolamine, N-methylethanolamine and aminobenzyl alcohol.

10. The addition polymerizable compound of claim [8] *6 or 7*, wherein said *compound containing one or two amino nitrogens is an* aliphatic [mono- or polyamine is] *diamine* selected from the group consisting of ethylenediamine, 1,2-propylenediamine, 1,3-propylenediamine, N,N-dimethylpropylenediamine, hexamethylenediamine and [poly(alkyleneoxide diamines)] *poly(alkyleneoxide) diamine.*

11. The addition polymerizable compound of claim [8] *6 or 7*, wherein said [aromatic mono- or polyamine] *compound containing one or two amino nitrogens* is benzylamine.

12. The addition polymerizable compound of claim [8] *6 or 7*, wherein said *compound containing one or two amino nitrogens is a* cyclic mono- or [polyamine is] *diamine* selected from the group consisting of piperazine, piperidine and morpholine.

[13. The addition polymerizable compound of claim 1, wherein said reaction product further comprises a moiety derived from the reaction of said polyisocyanate and a polyol.]

14. The addition polymerizable compound of claim [13,] *1* wherein said polyol is [selected from the group consisting of a polyester polyol, alkyl diol, alkyl triol and] polyoxyalkylene polyol.

15. The addition polymerizable compound of claim [13,] *1* wherein said polyol is a poly(caprolactone) polyol.

16. The addition polymerizable compound of claim [13 or] 1 wherein said polyisocyanate is selected from the group consisting of 1-isocyanatomethyl-5-isocyanato-1,3,3-trimethylcyclohexane, toluene diisocyanate and bis(4-isocyanatocyclohexyl)methane.

[17. The addition polymerizable compound of claim 1, wherein said polyfunctional compound is selected from the group consisting of acrylic acid and hydroxy-containing acrylic ester.]

18. The addition polymerizable compound of claim [17] *1*, wherein said [hydroxy-containing acrylic ester] *polyfunctional compound* is selected from the group consisting of 2-hydroxyethyl acrylate, 2-hydroxypropyl acrylate, 2-hydroxyethyl methacrylate and 2-hydroxypropyl methacrylate.

19. A coating composition containing addition polymerizable compound as defined in claim 1.

20. An article of manufacture having a cured film thereon made from the coating composition of claim 19.

21. The addition polymerizable compound of claim [2] *1* wherein said amide-containing compound [having at least one hydroxy functional group] is a reaction product of γ-butyrolactone and ethanolamine, and wherein said reaction product of said γ-butyrolactone and ethanolamine comprises N-(2-hydroxyethyl)pyrrolidone.

22. A blend of the reaction product of claim 1 and the additional reaction product of (a) a polyol;

(b) a polyisocyanate; and (c) a polyfunctional compound containing at least one functional group reactive with an isocyanato group of said polyisocyanate and which polyfunctional compound provides at least one ethylenically unsaturated functional group in said additional reaction product.

23. A method for preparing *a reaction product comprising* an addition polymerizable compound [comprising a reaction product] *having one or two amide groups, at least three urethane groups and at least one acrylate or methacrylate group*, said method comprising reacting together [the] components [of] *comprising:*

(a) an amide-containing compound [having] *which contains one or two amide groups and* at least one NCO-reactive hydroxy functional group;

(b) a polyisocyanate *which is a diisocyanate or a triisocyanate;* [and]

(c) a polyfunctional compound [containing at least one functional group reactive with an isocyanato group of said polyisocyanate and] which [polyfunctional compound] provides at least one [ethylenically unsaturated functional] *acrylate or methacrylate* group in said reaction product[.], *said polyfunctional compound being a hydroxy-containing*

*ester of acrylic acid or a hydroxy-containing ester of methacrylic acid; and*

*(d) polyol selected from the group consisting of polyester polyol and polyether polyol.*

[24. The method of claim 23, wherein said components and a polyol are reacted to provide in said reaction product a urethane moiety derived from the reaction of said polyisocyanate with said polyol.]

25. The method of claim 23, wherein said reaction product is made by (a) forming a blend comprising (1) an NCO-terminated intermediate having at least one urethane group prepared from the reaction of said polyisocyanate and said amide-containing compound [having at least one NCO-reactive hydroxy functional group]; and (2) an NCO-terminated intermediate having at least one urethane group prepared from the reaction of [a] *said* polyol and said polyisocyanate;

(b) reacting said blend of NCO-terminated intermediates with said polyfunctional compound, to provide [in] said reaction product [at least one amide group, at least one urethane group and at least one ethylenically unsaturated functional group].

26. The method of claim 25, wherein said reaction product is made by the steps of (a) adding a mixture of said amide-containing compound and said polyol to said polyisocyanate to form said blend comprising NCO-terminated intermediates; and (b) adding said polyfunctional compound to said blend of NCO-terminated intermediates.

27. The method of claim 26, wherein (a) said mixture is added gradually to said polyisocyanate; and (b) said polyfunctional compound is added gradually to said blend.

28. The method of claim [24] *23* or 25, wherein said polyol is [selected from the group consisting of polyester polyol, alkyl diol, alkyl triol and] polyoxyalkylene polyol.

29. The method of claim [28] *23 or 25*, wherein said [polyester] polyol is a poly(caprolactone) polyol.

30. The method of claim 23, wherein said amide-containing compound [having at least one hydroxy functional group] is selected from the group consisting of (a) a reaction product of a monocarboxylic acid and an aminoalcohol;

(b) a reaction product of an ester of a carboxylic acid and an aminoalcohol;

(c) a reaction product of a hydroxy carboxylic acid and a compound containing [at least] one *or two* amino [nitrogen] *nitrogens;*

(d) a reaction product of a lactone and ammonia or a compound containing [at least] one *or two* amino [nitrogen] *nitrogens*; and (e) a reaction product of a lactide and ammonia or a compound containing [at least] one *or two* amino [nitrogen] *nitrogens.*

[31. The method of claim 23, wherein said amide-containing compound having at least one hydroxy functional group is a polyamide polyol.]

32. The method of claim [30] *23*, wherein said [carboxylic] *amide-containing compound is a reaction product of (a) a monocarboxylic* acid [is] selected from the group consisting of formic acid, acetic acid, propionic acid and benzoic acid *and (b) an aminoalcohol.*

33. The method of claim [30] *23*, wherein said *amide-containing compound is a reaction product of (a) an* ester of a carboxylic acid [is] selected from the group consisting of methyl formate, ethyl acetate, [methyl-2-ethyl hexanoate] *methyl 2-ethylhexanoate* and dimethyl adipate *and (b) an aminoalcohol.*

34. The method of claim [30] *23*, wherein said *amide-containing compound is a reaction product of (a) a* hydroxy carboxylic acid [is] *selected from the group consisting of* hydroxyacetic acid, 2,2-bis(hydroxymethyl)propionic acid [or] *and* an aromatic hydroxy acid prepared from the reaction of phthalic anhydride and diethylene glycol *and (b) a compound containing one or two amino nitrogens.*

35. The method of claim [30] *23*, wherein said *amide-containing compound is a reaction product of (a) a* lactone [is] selected from the group consisting of γ-butyrolactone, γ-valerolactone, δ-valerolactone and ε-caprolactone *and (b) a compound containing one or two amino nitrogens.*

36. The method of claim [30] *34 or 35*, wherein said compound containing [at least] one *or two* amino [nitrogen] *nitrogens* is selected from the group consisting of aminoalcohol, aliphatic mono- or [polyamine] *diamine*, aromatic mono- or [polyamine] *diamine* and cyclic mono- or [polyamine] *diamine.*

37. The method of claim [36] *32 or 33*, wherein said aminoalcohol [that is reactable with one of said carboxylic acid, carboxylic acid ester, hydroxy carboxylic acid, lactone and lactide,] is selected from the group consisting of ethanolamine, diethanolamine, N-methylethanolamine and aminobenzyl alcohol.

38. The method of claim [36] *34 or 35*, wherein said *compound containing one or two amino nitrogens is an* aliphatic [mono- or polyamine is] *diamine* selected from the group consisting of ethylenediamine, 1,2-propylenediamine, 1,3-propylenediamine, N,N-dimethylpropylenediamine, hexamethylenediamine and [poly(alkyleneoxide diamines)] *poly(alkyleneoxide) diamine.*

39. The method of claim [36] *34 or 35*, wherein said [aromatic mono- or polyamine] *compound containing one or two amino nitrogens* is benzylamine.

40. The method of claim [36] *34 or 35*, wherein said *compound containing one or two amino nitrogens is a* cyclic mono- or [polyamine is] *diamine* selected from the group consisting of piperazine, piperidine and morpholine.

41. The method of claim 23[, 24] or 25, wherein said polyisocyanate is selected from the group consisting of 1-isocyanatomethyl-5-isocyanato-1,3,3-trimethylcyclohexane, toluene diisocyanate and bis(4-isocyanatocyclohexyl)methane.

[42. The method of claim 23 or 25, wherein said polyfunctional compound is selected from the group consisting of acrylic acid and hydroxy-containing acrylic ester.]

43. The method of claim [42] *23*, wherein said [hydroxy-containing acrylic ester] *polyfunctional compound* is selected from the group consisting of 2-hydroxyethyl acrylate, 2-hydroxypropyl acrylate, 2-hydroxyethyl methacrylate and 2-hydroxypropyl methacrylate.

44. The method of claim [30] *23* wherein said amide-containing compound [having at least one hydroxy functional group] is a reaction product of γ-butyrolactone and ethanolamine, and wherein said reaction product of said γ-butyrolactone and ethanolamine comprises N-(2-hydroxyethyl)pyrrolidone.

*45. The addition polymerizable compound of claim 6 or 7 wherein said compound containing one or two amino nitrogens is an aminoalcohol selected from the group consisting of ethanolamine, diethanolamine, N-methylethanolamine and aminobenzyl alcohol.*

*46. The method of claim 34 or 35 wherein said compound containing one or two amino nitrogens is an aminoalcohol selected from the group consisting of ethanolamine, diethanolamine, N-methylethanolamine and aminobenzyl alcohol.*

* * * * *